US010991840B2

(12) United States Patent
Ebel et al.

(10) Patent No.: US 10,991,840 B2
(45) Date of Patent: Apr. 27, 2021

(54) MULTI-JUNCTION SOLAR CELL

(71) Applicant: AZUR SPACE Solar Power GmbH, Heilbronn (DE)

(72) Inventors: Lars Ebel, Eisingen (DE); Wolfgang Guter, Stuttgart (DE); Matthias Meusel, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 15/375,802

(22) Filed: Dec. 12, 2016

(65) Prior Publication Data

US 2017/0170354 A1    Jun. 15, 2017

(30) Foreign Application Priority Data

Dec. 10, 2015  (DE) ............. 10 2015 016 047.8

(51) Int. Cl.
*H01L 31/0725* (2012.01)
*H01L 31/0304* (2006.01)
(Continued)

(52) U.S. Cl.
CPC .... *H01L 31/0725* (2013.01); *H01L 31/03046* (2013.01); *H01L 31/0687* (2013.01); (Continued)

(58) Field of Classification Search
CPC ........... H01L 31/03046; H01L 31/0687; H01L 31/06875; H01L 31/0725; H01L 31/0735; Y02E 10/544
See application file for complete search history.

(56) References Cited

U.S. PATENT DOCUMENTS 6,316,715 B1 * 11/2001 King .................. H01L 31/0304
                                                              136/249
6,660,928 B1    12/2003 Patton et al.
(Continued)

FOREIGN PATENT DOCUMENTS

DE    10 2005 000 767 A1    7/2006
DE    10 2012 004 734 A1    9/2013
(Continued)

OTHER PUBLICATIONS

Guter et al., "Current-matched triple-junction solar cell reaching 41.1% conversion efficiency under concentrated sunlight", Applied Physics Letters 94, 223504, pp. 1-3 (Jun. 1, 2009).
(Continued)

*Primary Examiner* — Lindsey A Bernier
(74) *Attorney, Agent, or Firm* — Muncy, Geissler, Olds & Lowe, P.C.

(57) ABSTRACT

A stacked multi-junction solar cell having a first subcell and second subcell, the second subcell having a larger band gap than the first subcell. A third subcell has a larger band gap than the second subcell, and each of the subcells include an emitter and a base. The second subcell has a layer which includes a compound formed at least the elements GaInAsP, and a thickness of the layer is greater than 100 nm, and the layer is formed as part of the emitter and/or as part of the base and/or as part of the space-charge zone situated between the emitter and the base. The third subcell has a layer including a compound formed of at least the elements GaInP, and the thickness of the layer is greater than 100 nm.

16 Claims, 2 Drawing Sheets

(51) Int. Cl.
*H01L 31/0687* (2012.01)
*H01L 31/0735* (2012.01)

(52) U.S. Cl.
CPC ........ *H01L 31/0735* (2013.01); *Y02E 10/544* (2013.01); *Y02P 70/50* (2015.11)

(56) References Cited

U.S. PATENT DOCUMENTS

| | | |
|---|---|---|
| 9,502,598 B2 | 11/2016 | Meusel et al. |
| 2002/0195137 A1 | 12/2002 | King et al. |
| 2005/0155641 A1 | 7/2005 | Fafard |
| 2006/0144435 A1 | 7/2006 | Wanlass |
| 2008/0163920 A1* | 7/2008 | Meusel ............. H01L 31/02168 136/246 |
| 2012/0211068 A1* | 8/2012 | Cornfeld ........... H01L 31/06875 136/255 |
| 2015/0053257 A1 | 2/2015 | Dimroth et al. |

FOREIGN PATENT DOCUMENTS

| | | |
|---|---|---|
| EP | 1 109 230 A2 | 6/2001 |
| EP | 1 134 813 A2 | 9/2001 |
| EP | 2 960 950 A1 | 12/2015 |

OTHER PUBLICATIONS

Boisvert et al., "Development of Advanced Space Solar Cells at Spectrolab", 35th IEEE PVSC, ISBN: 978-1-4244-5891-2, pp. 1-5, Honolulu, HI, (2010).

Dimroth et al., "Wafer bonded four-junction GaInP/GaAs/GaInAsP/GaInAs concentrator solar cells with 44.7% efficiency", in Progr. Photovolt: Res. Appl. 2014; 22: 277-282, pp. 277-282, DOI: 10.1002/pip.2475 (Jan. 13, 2014).

* cited by examiner

MULTI-JUNCTION SOLAR CELL

This nonprovisional application claims priority under 35 U.S.C. § 119(a) to German Patent Application No. 10 2015 016 047.8, which was filed in Germany on Dec. 10, 2015, and which is herein incorporated by reference.

BACKGROUND OF THE INVENTION

Field of the Invention

The present invention relates to a multi-junction solar cell.

Description of the Background Art

A multi-junction solar cell is known from the publication, "Current-matched triple-junction solar cell reaching 41.1% conversion efficiency under concentrated sunlight," by Guter et al., Applied Physics Letters 94, 223504 (2009)]. The disclosed structure is a metamorphic three-junction $Ga_{0.35}In_{0.65}P/Ga_{0.83}In_{0.17}As/Ge$ solar cell having a high efficiency. A metamorphic buffer having $Ga_YIn_{1-Y}As$ is used between the Ge substrate or the Ge subcell and the $Ga_{0.83}In_{0.17}As$ subcell.

Four-junction GaInP/GaAs/GaInAsP/GaInAs and five-junction GaInP/AlGaInAs/GaAs/GaInAsP/GaInAs solar cells based on semiconductor bond technology are furthermore known from the publication, "Development of Advanced Space Solar Cells at Spectrolab," by Boisvert et al. in Proc. of 35th IEEE PVSC, Honolulu, Hi., 2010, ISBN: 978-1-4244-5891-2. Another four-junction solar cell is also known from the publication, "Wafer bonded four-junction GaInP/GaAs/GaInAsP/GaInAs concentrator solar cells with 44.7% efficiency," by Dimroth et al. in Progr. Photovolt: Res. Appl. 2014; 22: 277-282.

In the latter two publications cited, GaInAsP solar cells having an energy gap of approximately 1.0 eV are deposited, lattice-matched, based on an InP substrate. The upper solar cells having a higher band gap are manufactured in reverse order on a GaAs substrate in a second deposition step. The entire multi-junction solar cell is formed by a direct semiconductor bond of the two epitaxial wafers, followed by a removal of the GaAs substrate and additional process steps. However, the manufacturing process is cost-intensive. Multi-junction solar cells without a semiconductor bond are furthermore known from EP 1 134 813 A2 (which corresponds to U.S. Pat. No. 6,316,715), EP 2 960 950 A1 and DE 10 2005 000 767 A1 (which corresponds to U.S. Pat. No. 9,502,598).

A four-junction GaInP/GaAs/GaInAs/buffer/Ge solar cell based on both semiconductor bond technology and on metamorphic epitaxy is known from DE 10 2012 004 734 A1, which corresponds to US 2015/0053257. The manufacturing costs are still high, due to the two necessary depositions on two separate substrates, the necessary substrate removal and the necessary bond process.

Optimizing the radiation hardness, in particular also for very high radiation doses, is an important objective in the development of space solar cells. In addition to increasing the beginning-of-life (BOL) efficiency, the goal is also to boost the end-of-life (EOL) efficiency.

The manufacturing costs are also extremely important. Lattice-matched and the metamorphic three-junction GaInP/GaInAs/Ge solar cells constitute the industrial standard at the point in time of the invention. For this purpose, multi-junction solar cells are manufactured by depositing the GaInP top cell and GaInAs middle cell onto a cost-effective Ge substrate relative to GaAs and InP substrates, the Ge substrate forming the bottom cell.

SUMMARY OF THE INVENTION

It is therefore an object of the invention to provide a device which refines the prior art.

According to an exemplary embodiment, a stacked multi-junction solar cell comprising a first subcell is provided, the first subcell predominantly including germanium, and comprising a second subcell, the second subcell having a larger band gap than the first subcell, and comprising a third subcell, the third subcell having a larger band gap than the second subcell, and each of the subcells including an emitter and a base, and the second subcell comprising a layer which includes a compound formed of at least the elements GaInAsP, and the thickness of the layer being greater than 100 nm, and the layer being formed as part of the emitter and/or as part of the base and/or as part of the space-charge zone situated between the emitter and the base, the third subcell including a layer including a compound formed of at least the elements GaInP, and the thickness of the layer being greater than 100 nm, and the layer being formed as part of the emitter and/or part of the base and/or as part of the space-charge zone situated between the emitter and the base and, in the second subcell, the phosphorus content of the layer being greater than 1% and less than 45%, and the indium content of the layer being less than 50%, and the lattice constant of the layer being less than 5.84 Å, and the lattice constant of the layer of the third subcell differing from the lattice constant of the layer of the second subcell by less than 0.2%, and no semiconductor bond being formed between two subcells of the multi-junction solar cell.

It is understood that the indicated phosphorus content, in particular, is related to the total content of the group-V atoms. Similarly, the indicated indium content is related to the total content of the group III atoms. In the $Ga_{1-X}In_XAs_{1-Y}P_Y$ compound, therefore, the indium content has the value X, and the phosphorus compound has the value Y, and this results in a Y value of 0.5 for a phosphorus content of 50%.

It is also noted that two directly consecutive subcells can include different elements.

It is also noted that the term "semiconductor bond" can cover, for example, the fact that no direct semiconductor bond is formed between two arbitrary subcells of the solar cell stack. The solar cell, therefore, is not manufactured from two substacks which were deposited on different substrates and are subsequently joined via a semiconductor bond. In particular, the solar cell stack does not have any amorphous intermediate layers.

The multi-junction solar cell can have a monolithic structure. It is also noted that an absorption of photons, and thereby a generation of charge carriers, takes place in each of the solar cells, the sunlight always first being irradiated through the subcell having the largest band gap. In other words, the solar cell stack first absorbs the short-wave component of the light via the topmost subcell. In the present case, the photons thus first flow through the second subcell and subsequently through the first subcell. In an equivalent diagram, the individual solar cells of the multi-junction solar cell are connected in series, i.e., the subcell having the lowest current has a limiting effect.

It should also be noted that the terms, emitter and base, can be understood to be either the p-doped or the n-doped layers in the particular subcell.

It should also be noted that the term, predominantly germanium, can be understood to mean those layers having a germanium proportion above 70%, preferably above 90% and most preferably above 95%. It should also be noted that, in the present case, the chemical abbreviations of elements are used synonymously with the full terms.

An advantage of the formation of a first subcell predominantly from germanium is that the first subcell may be easily and cost-effectively manufactured by activating the germanium substrate by means of As and/or P diffusion during the process of metal-organic vapor phase epitaxy (MOVPE).

To form the first subcell, in particular, no layers several micrometers thick formed of germanium, i.e. so-called bulk layers, need to be epitactically deposited to absorb the photons. As a result, the first subcell has low manufacturing costs. Studies have shown that a subcell formed of germanium has a low degradation when irradiated with 1 MeV electrons. It should be noted that the term, germanium layers, is understood to be layers which predominantly include germanium.

It is furthermore advantageous, that the formation of a second subcell formed of a compound of GaInAsP has a higher radiation stability compared to subcells formed of GaAs, GaInAs, AlGaAs and/or AlGaInAs.

In the case of a Ge, i.e. Germanium-based, multi-junction solar cell, the use of a compound predominantly made of GaInAsP, instead of a compound having GaInAs, is particularly advantageous for the second subcell, due to the higher radiation hardness of GaInAsP as opposed to GaInAs, particularly for phosphorus contents below 45%. Up to now, the use of an GaInAsP cell has seemed to be erroneous to those skilled in the art, since a GaInAsP subcell which has been lattice-matched to germanium has a higher energy gap compared to the GaInAs subcells used up to now. The beginning-of-life efficiency, also referred to as BOL, of the solar cell is reduced hereby during the formation of a lattice-matched triple-junction GaInP/GaInAs(P)/Ge solar cell.

It is also advantageous to incorporate as little aluminum as possible into subcells. Aluminum reacts very easily to reactor or source impurities due to residual moisture and/or oxygen and causes the material quality to deteriorate in an oxidized form. The yield may be increased hereby during the manufacture of multi-junction solar cells.

In an embodiment, the multi-junction solar cell includes exactly three subcells. Additionally or alternatively, the layer of the second subcell has an energy gap in the range of 1.2 eV to 1.3 eV.

In an embodiment, the layer of the third subcell formed of a compound including at least the elements AlGaInP.

An advantage is that the GaInP and AlGaInP compounds, in particular, have a high radiation stability.

In an embodiment, a metamorphic buffer can be formed between the first subcell and the second subcell, the buffer including a sequence of at least three layers, and the lattice constant increasing from layer to layer in the sequence in the direction of the second subcell. One advantage of the metamorphic buffer is that it opens up a greater possibility for setting the energy gap of the particular subcell, i.e., limitations may be compensated for or mitigated, such as the decreasing efficiency of the subcell during the formation of particularly radiation-hard cells due to the increasing energy gap as the phosphorus content rises.

In another embodiment, exactly four subcells are provided, the layer of the second subcell preferably having an energy gap in the range of 1.43 eV to 1.6 eV.

In another embodiment, the fourth subcell is disposed between the second subcell and the third subcell, and the layer of the fourth subcell comprises a compound including at least the elements AlGaInAs or GaInAsP. The layer of the fourth cell preferably formed of an AlGaInAs or an GaInAsP compound. Generally speaking, the thickness of the layer of the fourth subcell is greater than 100 nm, and the layer of the fourth subcell is formed as part of the emitter and/or as part of the base and/or as part of the space-charge zone situated between the emitter and the base.

In another embodiment, the fourth subcell is disposed between the first subcell and the second subcell and includes a layer formed of a compound which includes at least the elements GaInAs or GaInNAs, and the thickness of the layer is greater than 100 nm, and the layer is formed as part of the emitter and/or as part of the base and/or as part of the space-charge zone situated between the emitter and the base.

In an embodiment, a semiconductor mirror is formed, the semiconductor mirror being disposed between the first subcell and the second subcell and/or between the first subcell and the fourth subcell. It is understood that, in another refinement, additional semiconductor mirrors may be formed between additional subcell.

In an embodiment, the layer of the second subcell or the layer of the fourth subcells formed of a compound including at least the elements AlGaInAsP.

In am embodiment, the multi-junction solar cell includes exactly five subcells and/or the layer of the second subcell has an energy gap in the range of 1.3 eV to 1.4 eV or in the range of 1.43 eV to 1.7 eV.

In an embodiment, a fifth subcell is disposed between the second subcell and the third subcell. The fifth subcell comprises a layer formed of a compound which includes at least the elements AlGaInAs or AlGaInAsP or GaInP, the thickness of the layer of the fifth subcell being greater than 100 nm, and the layer of the fifth subcell being formed as part of the emitter and/or as part of the base and/or as part of the space-charge zone situated between the emitter and the base.

In an embodiment, the fifth subcell is disposed between the second subcell and the fourth subcell and has a layer formed of a compound which includes at least the elements or GaInAs. The thickness of the layer of the fifth subcell is greater than 100 nm and is formed as part of the emitter and/or as part of the base and/or as part of the space-charge zone situated between the emitter and the base.

In an embodiment, in the second solar cell, the phosphorus content of the layer is less than 35%, and the indium content of the layer is less than 45%, and/or the lattice constant of the layer is less than 5.81 Å.

In an embodiment, in the second solar cell, the phosphorus content of the layer is less than 25%, and the indium content of the layer is less than 45%, and/or the lattice constant of the layer is less than 5.78 Å.

In an embodiment, in the second solar cell, the thickness of the layer is greater than 0.4 µm or greater than 0.8 µm.

So-called hetero solar cells which include an emitter formed of GaInP and a space-charge zone and/or a base formed of GaInAs are not regarded as a second subcell. A hetero solar cell which includes an emitter formed of GaInP and a space-charge zone and/or a base formed of GaInAsP is, however, regarded as a second subcell.

In an embodiment, second subcells which do not have a multi-junction quantum well structure are meant in the present case. In particular, the second subcell has no periods formed of GaInAs/GaAsP in the space-charge zone.

In an embodiment, the lattice constant of the layer of the fourth subcell differs from the lattice constant of the layer of the second subcell by less than 0.2%.

In an embodiment, the lattice constant of the layer of the fifth subcell differs from the lattice constant of the layer of the second subcell by less than 0.2%.

In an embodiment, all subcells are lattice-matched to each other with regard to the germanium subcell.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 3a shows a cross-sectional view of an embodiment according to the invention as a five-junction solar cell in a first alternative;

FIG. 3b shows a cross-sectional view of an embodiment according to the invention as a five-junction solar cell in a second alternative;

FIG. 3c shows a cross-sectional view of an embodiment according to the invention as a five-junction solar cell in a third alternative;

FIG. 3d shows a cross-sectional view of an embodiment according to the invention as a five-junction solar cell in a fourth alternative;

FIG. 3e shows a cross-sectional view of an embodiment according to the invention as a five-junction solar cell in a fifth alternative; and FIG. 3f shows a cross-sectional view of an embodiment according to the invention as a five-junction solar cell in a sixth alternative.

DETAILED DESCRIPTION

Figure 1:
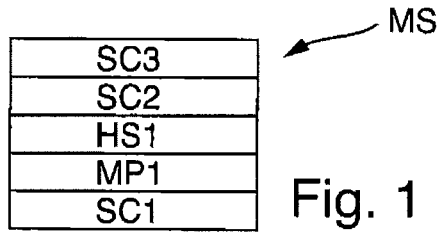
FIG. 1 shows a cross-sectional view of an embodiment according to the invention as a triple-junction solar cell.

The illustration in FIG. 1 shows a cross-sectional view of an embodiment according to the invention of a stacked, monolithic multi-junction solar cell MS, the individual solar cells of the stack being referred to below as subcells. Multi-junction solar cell MS includes a first subcell SC1, first subcell SC1 formed of germanium. A second subcell, formed of an GaInAsP compound, is disposed so as to rest on first subcell SC1. Second subcell SC2 has a larger band gap than first subcell SC1. A third subcell, formed of a GaInP compound or an AlGaInP component, is disposed so as to rest upon second subcell SC2, third subcell SC3 having the largest band gap. In the present case, second subcell SC2 has an energy gap between 1.2 eV and 1.3 eV.

A metamorphic buffer MP1 and a semiconductor mirror HS1 are formed between first subcell SC1 and second subcell SC2. Buffer MP1 is formed of a large number of layers, which are not illustrated individually, the lattice constant within buffer MP1 generally increasing from layer to layer of buffer MP1 in the direction of second subcell SC2. An introduction of buffer MP1 is advantageous if the lattice constant of second subcell SC2 does not match the lattice constant of first subcell SC1.

The reflection profile of first semiconductor mirror HS1 is matched to the band gap of second subcell SC2. In other words, the wavelengths absorbable by second subcell SC2 are reflected back to the absorption area of second subcell SC2. The thickness of the absorption area of second subcell SC2 may be significantly reduced and the radiation stability increased thereby.

It is understood that a tunnel diode—not illustrated—is formed between individual subcells SC1, SC2 and SC3.

It is also understood that each of the three subcells SC1, SC2 and SC3 includes an emitter and a base, the thickness of second subcell SC2 being greater than 0.4 μm.

In that the band gap of first subcell SC1 is smaller than the band gap of second subcell SC2, and the band gap of second subcell SC2 is smaller than the band gap of third subcell SC3, the sunlight shines through the surface of third subcell SC3.

Figure 2A:
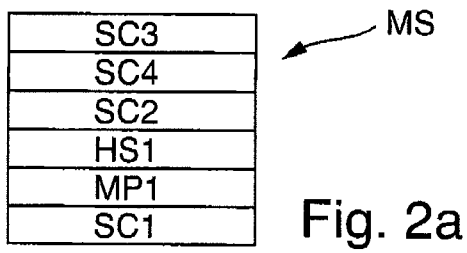
FIG. 2a shows a cross-sectional view of an embodiment according to the invention as a four-junction solar cell in a first alternative.

FIG. 2a shows a cross-sectional view of a embodiment according to the invention as a four-junction solar cell in a first alternative. Only the differences from the embodiment shown in connection with FIG. 1 are explained below. A fourth subcell SC4, formed of AlInGaAs compound, is formed between second subcell SC2 and third subcell SC3. The lattice constants of second subcell SC2, fourth subcell SC4 and third subcell SC3 are matched to each other or coincide with each other. In other words, subcells SC2, SC4 and SC3 are "lattice-matched" to each other. Fourth subcell SC4 has a larger band gap than second subcell SC2 but a smaller band gap than third subcell SC3.

Figure 2B:
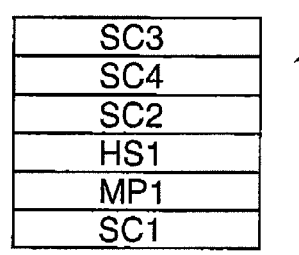
FIG. 2b shows a cross-sectional view of an embodiment according to the invention as a four-junction solar cell in a second alternative.

FIG. 2b shows a cross-sectional view of a embodiment according to the invention as a four-junction solar cell in a second alternative. Only the differences from the preceding embodiments are explained below. Fourth subcell SC4 now formed of an AlInGaAsP compound.

Figure 2C:
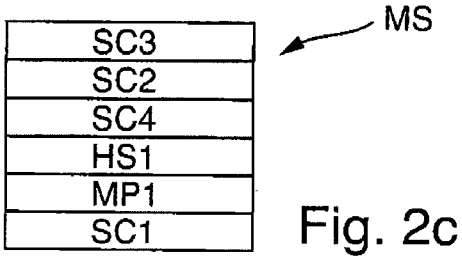
FIG. 2c shows a cross-sectional view of an embodiment according to the invention as a four-junction solar cell in a third alternative.

FIG. 2c shows a cross-sectional view of a embodiment according to the invention as a four-junction solar cell in a third alternative. Only the differences from the embodiment illustrated in FIG. 2b are explained below. Fourth subcell SC4 formed of a GaInAs compound and is formed between semiconductor mirror HS1 and second subcell SC2, second subcell SC2 now having an energy gap between 1.43 eV and 1.6 eV and formed of an AlInGaAsP compound.

Figure 2D:
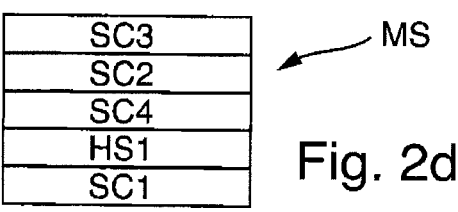
FIG. 2d shows a cross-sectional view of an embodiment according to the invention as a four-junction solar cell in a fourth alternative.

FIG. 2d shows a cross-sectional view of a embodiment according to the invention as a four-junction solar cell in a fourth alternative. Only the differences from the embodiment illustrated in FIG. 2c are explained below. Fourth subcell SC4 formed of a GaInNAs compound, and second subcell SC2 formed of an InGaAsP compound. All four subcells SC1, SC4, SC2 and SC3 are now lattice-matched to each other and essentially have the lattice constant of germanium. In other words, multi-junction solar cell MS does not include a metamorphic buffer MP1.

FIG. 3a shows a cross-sectional view of a embodiment according to the invention as a five-junction solar cell in a first alternative. Only the differences from the embodiment illustrated in FIG. 2a are explained below. A fifth subcell SC5, comprising a GaInP compound, is formed between fourth subcell SC2 and third subcell SC3. The lattice constants of second subcell SC2, fourth subcell SC4, fifth subcell SC5 and third subcell SC3 are matched to each other or coincide with each other. In other words, subcells SC2, SC4, SC5 and SC3 are "lattice-matched" to each other. Fifth subcell SC5 has a larger band gap than fourth subcell SC4 but a smaller band gap than third subcell SC3.

FIG. 3b shows a cross-sectional view of an embodiment according to the invention as a five-junction solar cell in a second alternative. Only the differences from the embodiment illustrated in FIG. 3a are explained below. Fourth subcell SC4 now formed of an AlInGaAsP compound.

FIG. 3c shows a cross-sectional view of an embodiment according to the invention as a five-junction solar cell. Only the differences from the embodiment illustrated in FIG. 3b are explained below. Fourth subcell SC4 formed of a GaInAs compound and is formed between semiconductor mirror HS1 and second subcell SC2, second subcell SC2 now having an energy gap between 1.3 eV and 1.4 eV and formed of an AlInGaAsP compound.

FIG. 3d shows a cross-sectional view of an embodiment according to the invention as a five-junction solar cell in a fourth alternative. Only the differences from the embodiment illustrated in FIG. 3c are explained below. Fourth subcell SC4 formed of a GaInNAs compound and is formed between semiconductor mirror HS1 and second subcell SC2, second subcell SC2 now having an energy gap between 1.43 eV and 1.74 eV and formed of an InGaAsP compound. Fifth subcell SC5 formed of an AlGaInAs compound. All five subcells SC2, SC4, SC5 and SC3 are now lattice-matched to each other and essentially have the lattice constant of germanium. In other words, multi-junction solar cell MS does not include a metamorphic buffer MP1.

FIG. 3e shows a cross-sectional view of a embodiment according to the invention as a five-junction solar cell in a fifth alternative. Only the differences from the embodiment illustrated in FIG. 3d are explained below. Fifth subcell SC5 formed of an AlGaInAsP compound.

FIG. 3f shows a cross-sectional view of a embodiment according to the invention as a five-junction solar cell in a sixth alternative. Only the differences from the embodiment illustrated in FIG. 3e are explained below. Fifth subcell SC5 formed of a GaInAs compound and is formed between fourth subcell SC4 and second subcell SC2, second subcell SC2 formed of an AlInGaAsP compound.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked multi-junction solar cell comprising:
   a first subcell having a first layer including germanium, the first subcell forming a substrate for the stacked multi-junction solar cell;
   a second subcell having a larger band gap than the first subcell;
   a third subcell having a larger band gap than the second subcell, the first, second and third subcells having an emitter and a base;
   a fourth subcell having a fourth layer;
   a metamorphic buffer formed between the first subcell and the second subcell, the metamorphic buffer having a sequence of at least three layers, and a lattice constant increasing from layer to layer in a sequence in a direction of the second subcell, the metamorphic buffer layer being directly adjacent to the first subcell,
   wherein the second subcell comprises a second layer formed of a compound that includes at least the elements GaInAsP, a thickness of the second layer being greater than 100 nm, the second layer being formed as part of the emitter or as part of the base or as part of a space-charge zone situated between the emitter and the base, and a lattice constant of the second layer is less than 5.84 Å,
   wherein the third subcell includes a third layer having a compound formed of at least the elements GaInP, a thickness of the third layer being greater than 100 nm, the third layer being formed as part of the emitter or as part of the base or as part of the space-charge zone situated between the emitter and the base, a lattice constant of the third layer of the third subcell differing from the lattice constant of the second layer of the second subcell by less than 0.2%,
   wherein, in the second subcell, a phosphorus content of the second layer is greater than 1 atomic % and less than 45 atomic % and an indium content of the second layer of the second subcell is less than 50 atomic %, and
   wherein a fifth subcell is disposed between the second subcell and the third subcell, and the fifth subcell includes a fifth layer having a compound formed of at least the compound GaInAs, and the thickness of the fifth layer is greater than 100 nm, and the fifth layer is formed as part of the emitter or as part of the base or as part of the space charge zone situated between the emitter and the base,
   wherein the second subcell, the third subcell, the fourth subcell, and the fifth subcell are lattice matched.

2. The multi-junction solar cell according to claim 1, wherein two directly consecutive subcells include different elements and no semiconductor bond is formed between the two subcells.

3. The multi-junction solar cell according to claim 1, wherein the fourth subcell is disposed between the second subcell and the third subcell, the fourth layer of the fourth subcell has a compound which includes at least the elements AlGaInAs or GaInAsP, a thickness of the fourth layer is greater than 100 nm, the fourth layer is formed as part of the emitter or as part of the base or as part of the space-charge zone situated between the emitter and the base; or
   wherein the fourth subcell is disposed between the first subcell and the second subcell, and the fourth layer of the fourth subcell is formed of a compound which includes at least the elements GaInAs or GaInNAs, and a thickness of the fourth layer is greater than 100 nm, and is formed as part of the emitter or as part of the base or as part of the space-charge zone situated between the emitter and the base.

4. The multi-junction solar cell according to claim 1, wherein the third layer of the third subcell is formed of a compound which includes at least the elements AlGaInP.

5. The multi-junction solar cell according to claim 1, wherein a semiconductor mirror is provided, and the semiconductor mirror is disposed between the first subcell and the second subcell or between the first subcell and the fourth subcell.

6. The multi-junction solar cell according to claim 1, wherein the second layer of the second subcell or the fourth layer of the fourth subcell is formed of a compound having at least the elements AlGaInAsP.

7. The multi-junction solar cell according to claim 1, wherein the multi-junction solar cell includes exactly five subcells or the second layer of the second subcell has an energy gap in the range of 1.3 eV to 1.4 eV or in the range of 1.43 eV to 1.7 eV.

8. The multi-junction solar cell according to claim 1, wherein, in the second subcell, a phosphorus content of the second layer is less than 35 atomic %, and an indium content of the second layer is less than 45 atomic %, or the lattice constant of the second layer is less than 5.81 Å.

9. The multi-junction solar cell according to claim 1, wherein, in the second subcell, a phosphorus content of the second layer is less than 25 atomic %, and an indium content of the second layer is less than 45 atomic % or the lattice constant of the second layer is less than 5.78 Å.

10. The multi-junction solar cell according to claim 1, wherein, in the second subcell, the thickness of the second layer is greater than 0.4 µm.

11. The multi-junction solar cell according to claim 1, wherein the second subcell does not include a multi-junction quantum well structure.

12. The multi-junction solar cell according to claim 1, wherein the lattice constant of the fourth layer of the fourth subcell differs from the lattice constant of the second layer of the second subcell by less than 0.2%.

13. The multi-junction solar cell according to claim 1, wherein the lattice constant of the fifth layer of the fifth subcell differs from the lattice constant of the second layer of the second subcell by less than 0.2%.

14. The multi-junction solar cell according to claim 1, wherein, in the second subcell, the thickness of the second layer is greater than 0.8 µm.

15. The multi-junction solar cell according to claim 1, wherein the metamorphic buffer is formed directly on the first subcell, and wherein the first subcell forming the substrate is an activated substrate of germanium.

16. The multi-junction solar cell according to claim 1, the third layer of the third subcell is formed as part of the emitter or as part of the space-charge zone situated between the emitter and the base of the third subcell.

\* \* \* \* \*